United States Patent [19]

Kong et al.

[11] Patent Number: 4,912,064

[45] Date of Patent: Mar. 27, 1990

[54] HOMOEPITAXIAL GROWTH OF ALPHA-SIC THIN FILMS AND SEMICONDUCTOR DEVICES FABRICATED THEREON

[75] Inventors: Hua-Shuang Kong, Raleigh; Jeffrey T. Glass, Apex; Robert F. Davis, Raleigh, all of N.C.

[73] Assignee: North Carolina State University, Raleigh, N.C.

[21] Appl. No.: 113,573

[22] Filed: Oct. 26, 1987

[51] Int. Cl.[4] .................... H01L 21/20; H01L 21/203
[52] U.S. Cl. .................................... 437/100; 156/612; 156/DIG. 64; 148/DIG. 148; 437/105; 437/106; 427/429
[58] Field of Search ............... 437/100, 105, 106, 103; 148/DIG. 148; 156/DIG. 64, 610, 612, 600; 427/248.1, 249

[56] References Cited

U.S. PATENT DOCUMENTS

| 3,520,740 | 7/1970 | Addamiano | 437/100 |
|---|---|---|---|
| 3,956,032 | 5/1976 | Powell et al. | 156/612 |
| 3,960,619 | 6/1976 | Seiter | 156/612 |
| 4,147,572 | 4/1979 | Vodakov et al. | 156/DIG. 64 |

FOREIGN PATENT DOCUMENTS

| 0043200 | 4/1979 | Japan | 156/DIG. 64 |
|---|---|---|---|
| 0035099 | 2/1984 | Japan | 156/DIG. 64 |
| 0155512 | 7/1987 | Japan | |

OTHER PUBLICATIONS

Matsunami et al., "Epitaxial Growth of α-SiC Layers by Chemical Vapor Deposition Technique", J. of Crystal Growth 31 (1975), pp. 72-75.
Brander et al., "Solution Grown SiC p-n Junctions", Brit. J. Appl. Phys. (J. Phys. D), 1969, Ser. 2, vol. 2, pp. 309-318.
Carter et al., "Kinetics and Mechanisms of High-Temperature Creep in Silicon Carbide: II, Chemically Vapor Deposited", J. Am. Cer. Soc., vol. 67, No. 11, Nov. 1984, pp. 732-740
Kong et al., "Chemical Vapor Deposition and Characterization of 6H-Silicon Carbide Thin Film on Off Axis 6H-Silicon Carbide Substrates", J. Appl. Phys., vol. 64, No. 5, 1988, pp. 2672-2679.
Harris et al., "Growth Characteristics of Alpha–Silicon Carbide I, Chemical Vapor Deposition", J. Electrochem. Soc., vol. 118, No. 2, Feb. 1971, pp. 335-337.
Harris et al., "Growth Characteristics of Alpha–Silicon Carbide II, Equilibrium Considerations", J. Electrochem. Soc., vol. 118, No. 2, Feb. 1971, pp. 338-340.
Wessels et al., "Epitaxial Growth of Silicon Carbide by Chemical Vapor Deposition", Int'l. Conf. on Silicon Carbide, Columbia, S.C., Univ. of S.C., 1973 (Abstract).
Powell, "Silicon Carbide: Progress in Crystal Growth", Novel Refractory Semiconductors Symposium, Ed. Emin., D.; Aselage, T. L.; Wood, C., Mat'l. Res. Soc., 1987, pp. 159-170.
Wessels, B., Gatos, H. C., and Witt, A. F. "Epitaxial Growth of Silicon Carbide by Chemical Deposition," Silicon Carbide, p. 25 (1974).
Nishino, S., Matsunami, H. and Tanaka, T., "Growth and Morphology of 6H-SiC Epitaxial Layers by CVD" J. Crystal Growth, 144 (1978).
Muench, W. V. and I. Pfaffeneder, "Epitaxial Deposition of Silicon Carbide from Silicon Tetrachloride and Hexane," Thin Solid Films, 31, 39 (1976).
Powell, J. A., and Will, H. A., "Epitaxial Growth of 6H SiC in the Temperature Range 1320-1390 C", J. Appl. Phys., 44, 177 (1973).
Yoshida, S., E. Sakuma, S. Misawa and S. Gonda, "A New Doping Method Using Metalorganics in Chemical Vapor Deposition of 6H-SiC," J. Appl. Phys., 55 (1), 169 (1984).
Minagwa, S. and H. C. Gatos, "Epitaxial Growth of a-SiC From the Vapor Phase", Japanese J. of Applied Phys., 10 (12), 1680 (1971).

(List continued on next page.)

Primary Examiner—Brian E. Hearn
Assistant Examiner—Mary Wilczewski
Attorney, Agent, or Firm—Bell, Seltzer, Park & Gibson

[57] ABSTRACT

Device quality monocrystalline Alpha-SiC thin films are epitaxially grown by chemical vapor deposition on Alpha-SiC [0001] substrates prepared off axis.

21 Claims, 8 Drawing Sheets

OTHER PUBLICATIONS

Jennings, V. J., A. Sommer and H. C. Chang, "The Epitaxial Growth of Silicon Carbide," *J. Electrochem, Soc., 113* (7), 728 (1966).

Kuroda, N., K. Shibahara, W. S. Yoo, S. Nishino and H. Matsunami, "Homoepitaxial Growth of 6H–SiC at Low Temperatures", Abstracts of Spring Meeting of Applied Physics Society, 28 p-ZC-2, p. 35 (1987).

Kuroda, N., K. Shibahara, W. S. Yoo, S. Nishino and H. Matsunami, "Homoepitaxial Growth of 6H–SiC at Low Temperatures", Abstracts of Spring Meeting of Applied Physics Society, 28 p-ZC-3, p. 35 (1987).

H. J. Kim, S. Kong, J. A. Edmond, J. T. Glass and R. F. Davis, "Chemical Vapor Deposition, In Situ Doping and MESFET Performance of Beta-SiC Thin Films" Submitted to Silicon Carbide Synposium, American Ceramic Society, Aug. 2-5, 1986.

HOMOEPITAXIAL GROWTH OF ALPHA-SIC THIN FILMS AND SEMICONDUCTOR DEVICES FABRICATED THEREON

FIELD OF THE INVENTION

The invention relates to the growth of Alpha-SiC thin films. More particularly, the invention relates to high purity, low defect, device quality monocrystalline Alpha-SiC thin films which are epitaxially grown via chemical vapor deposition on Alpha-SiC [0001] substrates prepared "off axis."

BACKGROUND

Silicon carbide is considered a superior candidate material for high temperature, high power and high frequency electronic devices due to its high melting point, relatively large energy bandgap, high saturated electron drift velocity, breakdown field, high thermal conductivity and chemical resistance. Its large energy bandgap also makes it an excellent material for the blue light-emitting diodes and radiation intensive environments.

Silicon carbide exists in hexagonal, rhombohedral and cubic crystal structures. Generally, the cubic, zinc blende form is referred to as "Beta-SiC" whereas the numerous polytypes of the hexagonal and rhombohedral forms are collectively referred to as "Alpha-SiC." The most common Alpha form is 6H SiC.

Beta-SiC is usually considered more desirable than Alpha-SiC for the aforementioned electronic applications since its electron mobility is postulated to be higher than that of Alpha-SiC over the temperature range of 300 to 1000 K. Furthermore, the growth temperatures of Beta-SiC are generally lower than those of Alpha forms for various types of growth, for example chemical vapor deposition (CVD). However, the difficulties in the growth of high quality, low carrier concentration Beta-SiC thin films do not allow the electron mobility to attain these postulated values. This is believed to be due to the defects present in Beta-SiC films, especially those grown on Si substrates. Dislocations, stacking faults and antiphase domain boundaries (APBs) are generated from the Beta-SiC/Si interface and extend from the interface to approximately 3 μm into the bulk film. In fact, many even propagate up to the as-grown surface. This phenomenon is caused by the differences in the lattice parameters (~20%) and thermal expansion coefficients (~8% at 473 K) between the substrate and film. Although off-axis Si (100) substrates have been employed to help eliminate APBs, the dislocations and stacking faults remain. When Alpha-SiC substrates are utilized for the growth of Beta-SiC, device quality films have been obtained, but defects persist in the form of double positioning boundaries (DPBs).

The growth of 6H SiC films on 6H SiC substrates via CvD has been reported since the late 1960's. Several researchers reported the growth of 6H SiC on 6H SiC (0001) in the temperature range of 1500°–1750° C., but a mosaic morphology was observed on the as-grown surface. Such a mosaic structure is believed to be caused by DPBs. The growth of 6H SiC in the temperature range of 1320°–1590° C. was also reported, in which case, the growth direction was perpendicular to the [0001] axis. However, growth of 6H SiC in this direction while rapid, is quite irregular and results in unacceptable defect levels and surface morphologies.

SUMMARY OF THE INVENTION

The present invention provides novel Alpha-SiC thin films of an extraordinary, high quality that renders them useful in the fabrication of exceptionally good electronic devices. The films may be grown homoepitaxially by CVD in the form of Alpha-SiC films on off axis 6H SiC substrates. One advantage of the invention is that it permits substantial latitude in the film growth conditions so that the film growth conditions may be controlled as desired to enhance growth rate, smooth surface morphology or other film characteristics, while in all instances producing very high quality films. The invention is well suited for use in conjunction with currently emerging technologies for the seeded sublimation growth of large, high quality Alpha-Sic single crystals, which crystals may be sliced into wafers that serve as the substrates for thin film CVD growth. Extensive examination of films of the invention, and the fabrication of electronic devices on the films, has verified their high quality and suitability for industrial applications.

In one aspect, the invention may be defined as a semiconductor product in the form of a device quality SiC film deposited on a SiC substrate wherein the substrate is formed from Alpha-SiC and has a flat interface surface that is inclined between an angle greater than one degree and approximately 12° off axis with respect to a basal plane thereof substantially towards one of the $<11\bar{2}0>$ directions. The thin film preferably is an Alpha-SiC film of the same polytype as the substrate homoepitaxially deposited on the substrate interface surface. In certain preferred embodiments of the invention the polytype for the substrate and thin film is selected as 6H SiC. The angle of off axis inclination of the interface surface of the substrate is preferably within the range from approximately 3° to approximately 6° being more preferred, and with an inclination of approximately 3° being the most preferred. Semiconductor products of the present invention consistently exhibit a smooth surface morphology, substantially uniform thickness and a low, device compatible defect density within the bulk film. The film may be doped to show either p-type or n-type conductivity at selected locations therein.

In another aspect, the present invention may be defined as a method of producing a monocrystalline 6H SiC thin film on a 6H SiC substrate by the following steps: (i) lapping a 6H SiC substrate crystal to expose a planar surface that is inclined more than one degree off axis with respect to a basal plane thereof substantially towards one of the [11$\bar{2}$0] directions; (ii) preparing the off axis planar surface of the substrate to be receptive to epitaxial growth thereon; (iii) heating the substrate crystal in a growth chamber; (iv) introducing a carrier gas, a vaporized silicon-containing material and a vaporized carbon-containing material into the growth chamber while providing sufficient energy to create surface diffusion of silicon and carbon species at the substrate planar surface and establish a homoepitaxial growth of monocrystalline 6H SiC; and (v) maintaining the carrier gas, silicon-containing material and carbon-containing material flows and the energy levels for a time sufficient to grow a film of desired thickness.

BRIEF DESCRIPTION OF THE DRAWINGS

FIGS. 3(a) and 3(b) are optical micrographs of as grown surface morphologies of films grown in accordance with the present invention. FIG. 3(a) illustrates the surface morphology achieved by growing 6H SiC thin films on a 6H SiC substrate inclined approximately 3° off axis with respect to the (000$\bar{1}$)C face substantially towards one of the $<11\bar{2}0>$ directions. FIG. 3(b) shows the surface morphology of a film grown off axis with the same inclination with respect to the (0001)Si face.

DETAILED DESCRIPTION OF THE INVENTION

Figure 1:
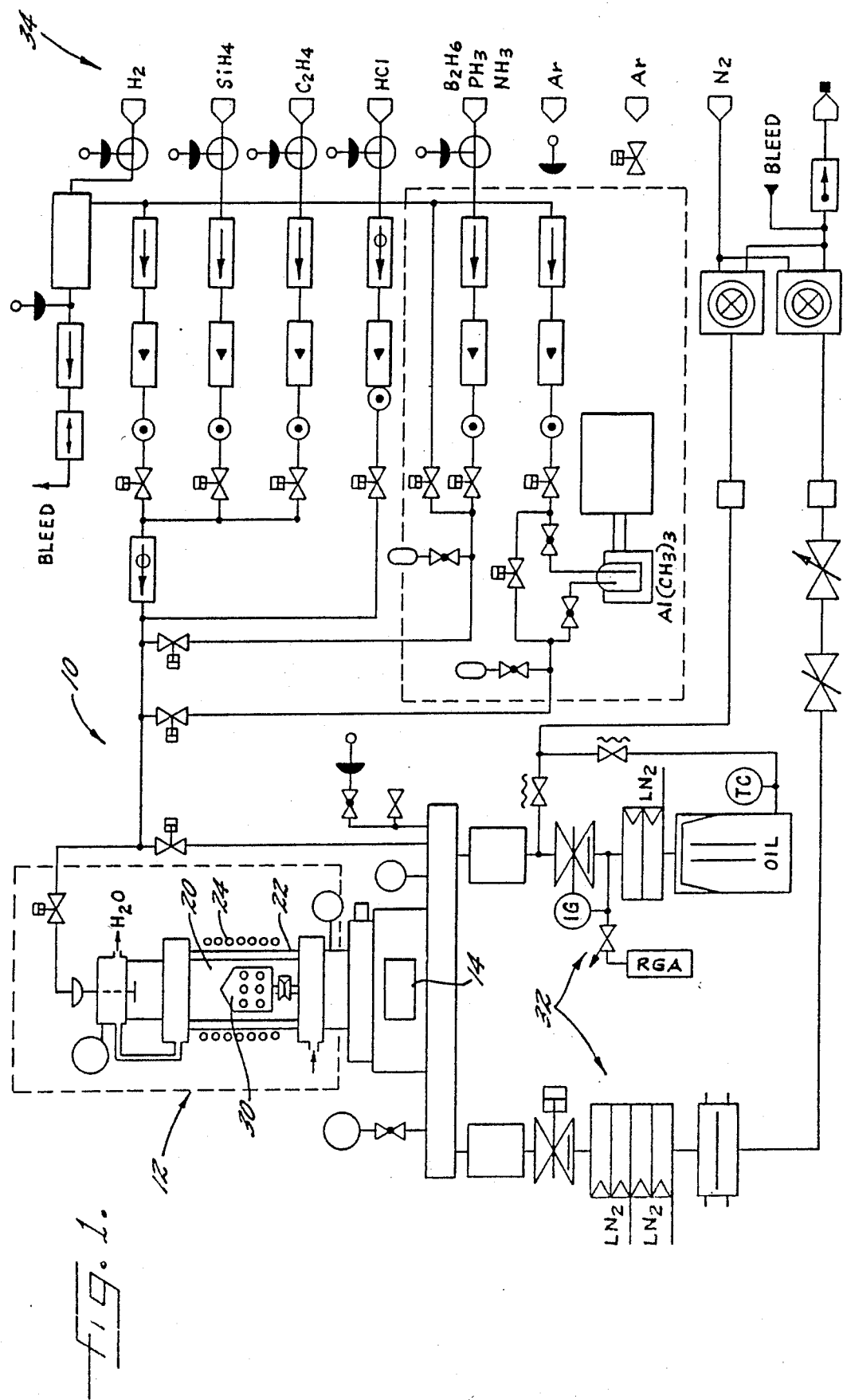
FIG. 1 is a schematic diagram of the CVD system employed for the growth and doping of monocrystalline Alpha-SiC thin films in accordance with the present invention.

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

The present invention concerns a novel technology that permits the growth of very high quality, commercially useful Alpha-SiC thin films grown on "off-axis" Alpha-SiC substrates. In a related development, device quality Beta-SiC films have been grown on the (0001)Si faces and (000$\bar{1}$)C faces of Alpha-SiC substrates, as described in commonly assigned application Ser. No. 113,921, filed concurrently herewith, entitled "Growth of Beta-SiC Thin Films and Semiconductor Devices Fabricated Thereon," inventors Davis, et al., incorporated herein by reference.

The Alpha-SiC substrate crystals utilized in the examples set forth below are of three origins. First are industrial 6H SiC crystals obtained from an Acheson furnace. These crystals have mirror-like surfaces and are black, indicating high impurity content. Second are 6H SiC crystals obtained from an unseeded Lely sublimation process. These crystals are substantially clear, indicating relatively high purity. The third type of crystals are 6H SiC crystals obtained from a novel seeded sublimation technique recently developed at North Carolina State University, Raleigh, N.C. This new technique produces very high quality, bulk single crystals which may be sliced into wafers, with the wafers being used as 6H SiC substrates for the present invention.

This sublimation process and the bulk single crystals grown therein are described in commonly assigned, copending application Ser. No. 113,565, filed on even date herewith, entitled "Sublimation of Silicon Carbide To Produce Large Device Quality Single Crystals Of Silicon Carbide," inventors Davis, Carter and Hunter, incorporated herein by reference.

Prior to proceeding with a description of the preparation of the substrate crystals and the CVD processing, a brief description of CVD system 10 will be given, with the understanding that a more detailed description of a substantially similar system is contained in the cataloged doctoral thesis of Hyeong Joon Kim, Entitled "Epitaxial Growth, Doping and Characterization of Monocrystalline Beta Silicon Carbide Thin Films and Fabrication of Electronic Devices," 1985, Department of Materials Engineering, North Carolina State University, Raleigh, N.C., incorporated herein by reference.

CVD system 10 includes a main reactor portion 12 having a loading chamber 14 which communicates with the CVD growth chamber 20. The sides of growth chamber 20 are defined by a quartz tube 22. Heat is supplied to the growth chamber 20 by means of an RF induction coil 24. Substrates are loaded into system 10 on a SiC-coated graphite susceptor 30.

Pressure within growth chamber 20 is controlled by a pressure control system which is referred to generally by reference numeral 32. The gas supply systems are denoted by the reference numeral 34. Systems 32 and 34, and certain other components of CVD system 10, are not described in detail herein, but a complete description is contained in the thesis referred to above.

EXAMPLE 1

For the process described in this Example 1, black, industrial 6H SiC (000$\bar{1}$) wafers obtained at random from an Acheson furnace were employed. Since SiC is a polar material, (0001) wafers can terminate in either a Si layer (0001) or a C layer (000$\bar{1}$) and a thin crystal with two parallel, smooth surfaces will contain one Si face and one C face opposite to each other. However, the Acheson derived crystals generally contain only one reasonably flat face which is usually, but not always, Si. They usually also contain small (1$\bar{1}$00) facets which allow the determination of the crystal orientation.

To prepare these substrates, each was first lapped approximately 3° off of $<0001>$ towards one of two selected orientations using a set of beveling tools. The first orientation is 3° towards one of the $<11\bar{2}0>$ directions. The second orientation is 3° towards one of the $<1\bar{1}00>$ directions. (It will be appreciated that due to the hexagonal nature of 6H SiC, each of these families of directions refers to six directions.) Secondly, the lapped side was mounted onto a flat plate to lap the other side to obtain a substrate with two parallel surfaces.

The lapped wafers were then polished down utilizing a diamond paste. Next each 6H SiC substrate was preoxidized at 1200° C. in a flowing dry oxygen atmosphere for 1.5 hour to oxidize approximately 500 Å of the polished surface in order to remove the subsurface damage caused by the mechanical polishing.

At this stage in the process, by estimating oxide thicknesses, the polarity of each substrate was determined since the C face oxidizes more rapidly than the Si face. Following this procedure, four kinds of substrates were prepared and used. They were 6H SiC Si (0001) face and C (000$\bar{1}$) face 3° off towards one of the <11$\bar{2}$0> directions and towards one of the <1$\bar{1}$00> directions.

Next, the oxide layer on each substrate was removed by immersion in a 49% concentration of hydroflouric acid, followed by rinsing in deionized water.

The substrate crystal which has been prepared for epitaxial growth thereon, preferably by the oxidation and etching steps discussed above, is placed on the SiC-coated graphite susceptor 30 and then loaded into the loading chamber 14 of system 10. The susceptor is next moved upwardly into growth chamber 20, which is the susceptor position illustrated in FIG. 1. Following positioning the susceptor and substrate in the growth chamber, the growth chamber is evacuated to $10^{-5}$ Torr.

Evacuation is achieved by the pressure control system 32 which includes a suitable pump, such as a diffusion pump or turbomolecular pump. Next the growth chamber is backfilled for 10 minutes with pure $H_2$ at a 3 liters/minute flow rate to 760 Torr in order to purge the system. Preferably the $H_2$ is purified to a purity well in excess of 99.99 purity prior to introduction into the CVD system. This enhanced purity of the $H_2$ gas may be accomplished by known Pd-Ag purification techniques.

Figure 2:
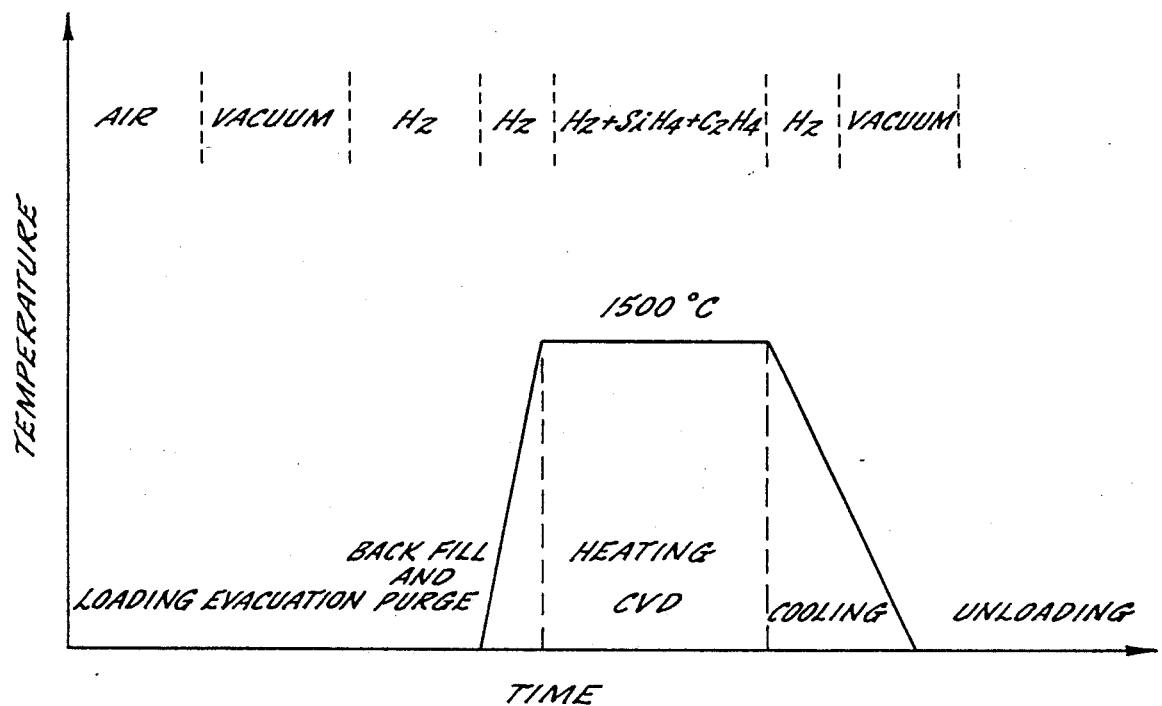
FIG. 2 is a schematic diagram illustrating the growth sequence employed for the growth of monocyrstalline Alpha-SiC thin films on "off axis" Alpha-SiC substrates in accordance with the present invention.

Following the purging step, the $H_2$ gas flow is continued while RF induction coil 24 heats the growth chamber to a growth temperature of approximately 1500° C., a temperature within the prefered operational range of about 1400° C. to about 1700° C. (The temperature sequence for the deposition is shown in FIG. 2). Once the growth temperature is attained, it is held while the $H_2$ gas flow continues for a period of time sufficient to etch away any native oxide layer on the substrate surface. An $H_2$ etching period of 10 minutes at approximately 760 Torr has been found to be sufficient to etch away approximately 10 Å.

With the etching complete, the $H_2$ gas flow continues, serving as the carrier gas for the growth process. A vaporized silicon containing material in the form of a silicon source gas, $SiH_4$ (silane), and a vaporized carbon containing material in the form of a carbon source gas, $C_2H_2$ (ethylene), are introduced into the growth chamber with the carrier gas. The ratio of the sum of $SiH_4$ and $C_2H_4$ flow rates to the flow rate of $H_2$ was held at approximately 1:3000 (sccm/sccm). The $SiH_4/C_2H_4$ flow rate ratio was maintained at two. Preferably the source gases are of very high purity, with the silane containing less than 2 ppm nitrogen impurities and the ethylene containing less than 10 ppm nitrogen impurities. The pressure in the growth chamber is held steady at approximately 760 Torr.

Following a CVD growth period of approximately 3 hours, (yielding a film thickness of 2.5 μm to 5 μm), RF heater 24 was turned off and the flow of source gases was discontinued. The $H_2$ gas flow was allowed to continue for the first 10 minutes of the cool down period. The cool down period then continued for a total of about 2 hours. The growth chamber was then filled with argon gas to 760 Torr, followed by removal of susceptor 30 and the substrate/thin film product.

Throughout the growth period the temperature, pressure and gas flows were maintained constant (i.e. without substantial fluctuations) in order to encourage consistent growth of a quality monocrystalline film.

EXAMPLE 2

A process substantially the same as that of Example 1 was carried out utilizing 6H SiC crystals obtained from an unseeded Lely sublimation process as the substrate materials.

EXAMPLE 3

A process substantially the same as that of Example 1 was carried out utilizing wafers cut from large, single crystals formed by the seeded sublimation process described in copending application Ser. No. 113,565, referred above.

EXAMPLE 4

Thin films grown in accordance with the processes of Examples 1–3 may be doped in order to achieve p- and n-type layers in the Beta-SiC films. The p- and n-type dopants of Al and B (Group III), and N and P (Group V), respectively, may be incorporated into the films directly during growth. This was accomplished by introducing $Al(CH_3)_3$, $B_2H_6$, $N_2$ (or $NH_3$) and $PH_3$ directly into the primary gas stream, in the case of $Al(CH_3)_3$, by bubbling the $H_2$ carrier gas through liquid $Al(CH_3)_3$.

EXAMPLE 5

The process of Example 1 was repeated utilizing 6H SiC substrates that were prepared approximately 6° off axis, instead of 3°. The films were monocrystalline 6H SiC of a high quality comparable to that of the films grown 3° off axis

Analysis of Films

Utilizing the growth conditions and substrates previously discussed, very high quality 6H Alpha-SiC films were obtained in all cases. As discussed below, this result is somewhat unusual because Beta-SiC is expected to be more stable at the growth temperature employed.

The films were found to grow at a uniform rate across their growth surface, resulting in films of substantially uniform thickness. The growth rate of the films was found to be directly related to growth temperature and source gas to carrier gas ratio. Because of the exceptionally high quality of the films, it is believed that the growth temperature and gas ratio can be increased substantially, producing device quality films at faster growth rates. While the off axis inclinations utilized in the above examples were 3° C. and 6°, the nature of the lattice structures of Alpha-SiC polytypes, including in particular the 6H SiC polytype, indicates that off axis inclinations in the range from an angle in excess of 1° to an angle of 20° will produce high quality, monocrystalline growth.

A thorough analysis was undertaken utilizing a variety of techniques to more completely understand these films as discussed in the following subsections entitled; (1) surface morphology; (2) TEM analyses; (3) electrical properties.

Surface Morphology

The surface morphologies of the as grown SiC thin films were evaluated using a Nomarski phase contrast optical microscope.

Figure 3A:
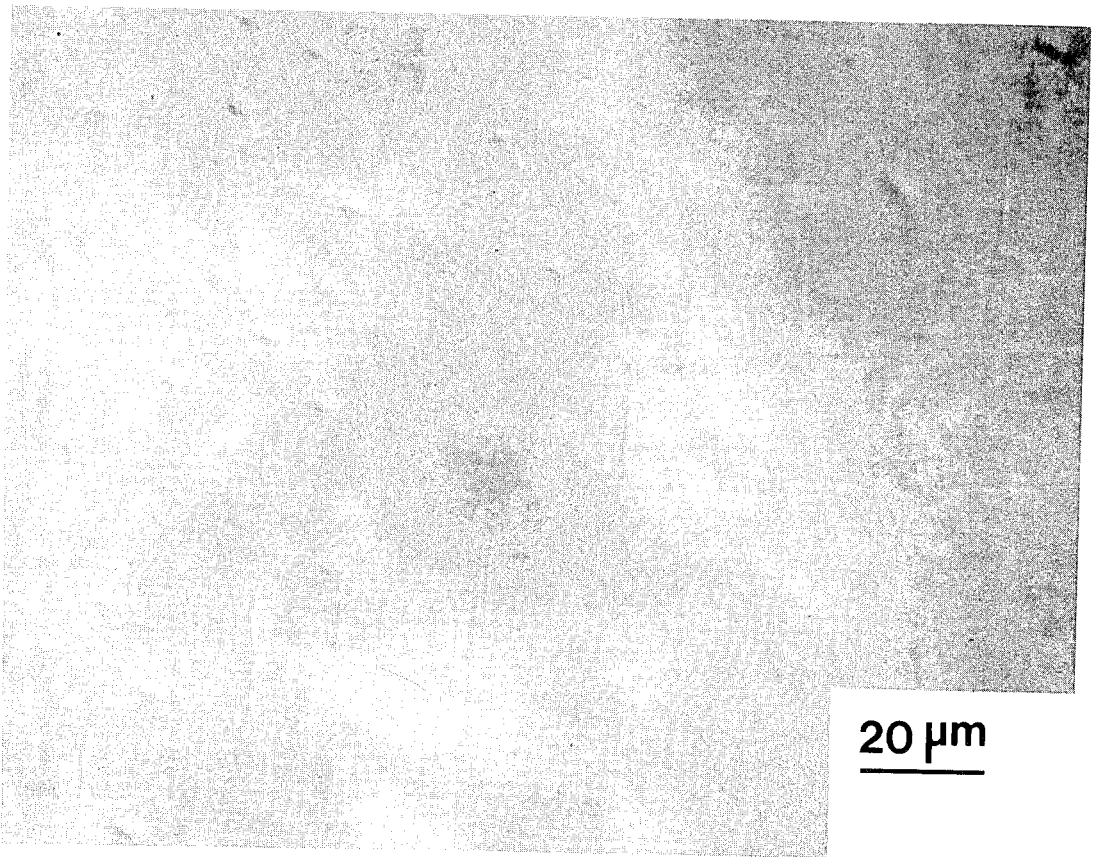
Figure 36:
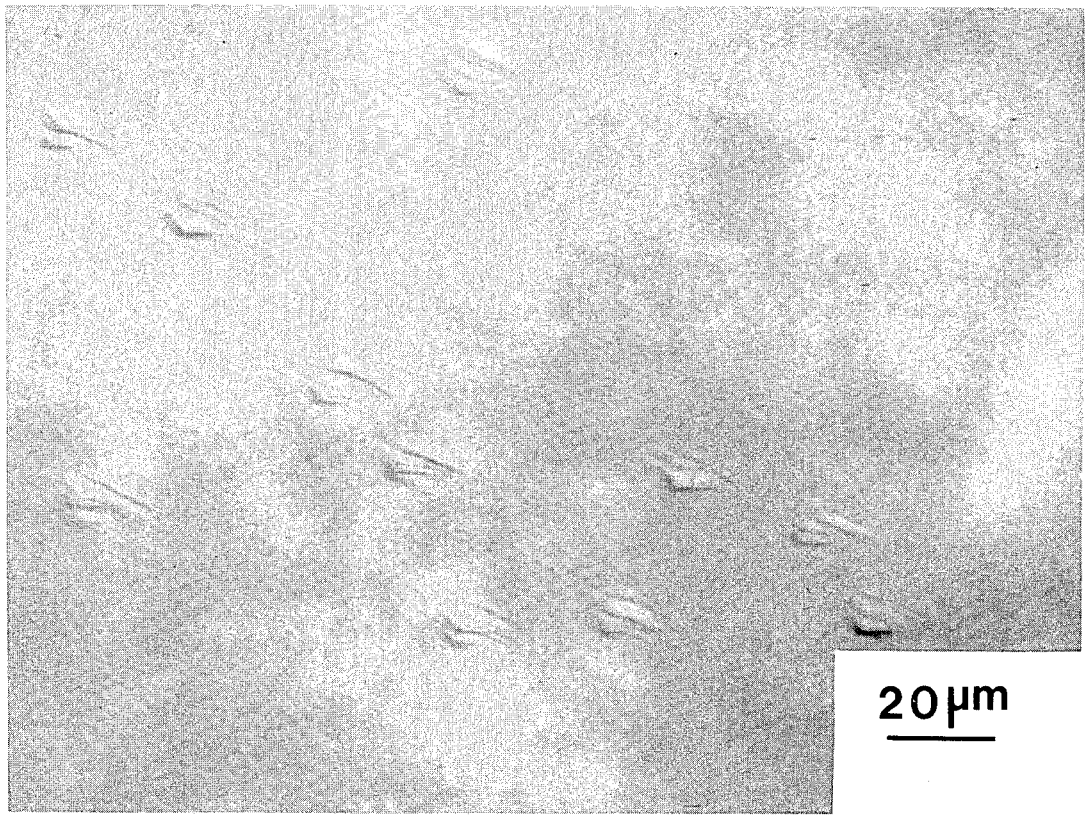

FIG. 3(a) shows the as grown surface of a 6H SiC thin film grown under the conditions of Example 1 for a substrate prepared approximately 3° off axis with respect to the $(000\bar{1})C$ face towards one of the $<11\bar{2}0>$ directions. The as grown surface is very flat, shiny and smooth. FIG. 3(b) shows the as grown surface of a film grown under identical conditions except that the growth surface was prepared 3° off axis with respect to the (0001)Si face. While the surface of FIG. 3(b) is very good, there are small elongated pyramidal features in groups of two to five thereon. Analysis of films has indicated that those grown off axis towards one of the $<11\bar{2}0>$ directions from the C face are somewhat smoother overall than those grown off axis of the Si face with the same tilting orientation.

The films grown 3° off axis from the C or Si faces towards one of the $<1\bar{1}00>$ directions generally demonstrated a rougher surface morphology.

As compared to films of the prior art that have been thoroughly analyzed, the films shown in FIGS. 3(a) and 3(b) are much smoother. From a comparision of as grown surfaces alone, it appears that stacking faults, DPBs and other defects in the films have been virtually eliminated. Therefore, the films grown on the 6H SiC substrates 3° off one of the basal planes towards one of the $<11\bar{2}0>$ directions were much smoother than films grown previously. This significantly improves the properties of the film as discussed later.

TEM Analyses

Thin films with smooth surfaces were prepared to be examined by cross-sectional transmission electron microscopy (XTEM) and plan view TEM coupled with transmission electron diffraction (TED). For the plan view TEM examination, samples were lapped from the substrate side to approximately 20 mils. They were then dimpled to about 2.5 mils. Finally, Ar+ ion milling was employed to thin the sample from both sides until a small hole was observed.

Figure 4:
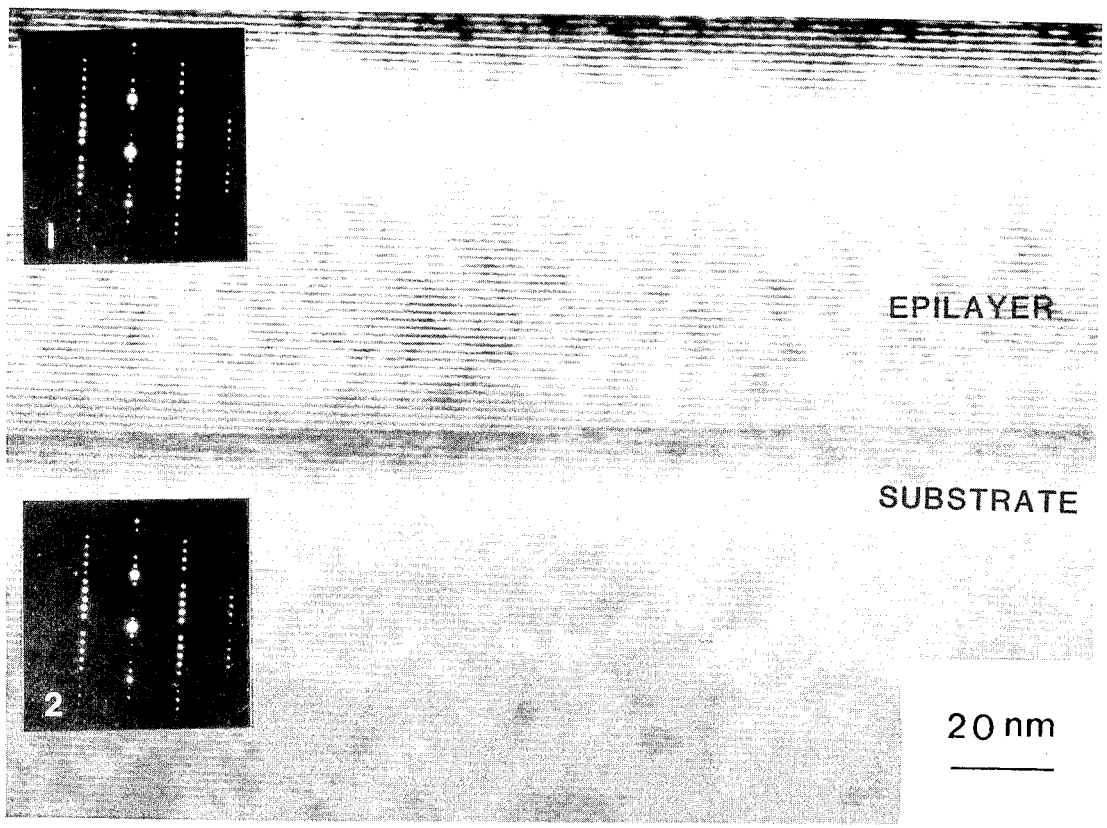
FIG. 4 is an XTEM micrograph of the 6H SiC/6H SiC interface region of the specimen for which the surface is illustrated in FIG. 3(a). The two TED patterns illustrated at the left of FIG. 4 are from the epilayer and substrate respectively and show identical characteristics of [11$\bar{2}$0] pole of 6H silicon carbide.

TEM analyses were performed on the as grown 6H SiC films grown 3°off the 6H SiC C $(000\bar{1})$ face towards one of the $<11\bar{2}0>$ directions. The microstructure of the epilayer/substrate interface region was characterized using XTEM in conjunction with TED. The results of this analysis are presented in FIG. 4. Diffraction patterns (1) and (2) were obtained from the epilayer and substrate, respectively, and show identical reflections characteristic of the 6H SiC $[11\bar{2}0]$ pole. Lattice fringes can be seen in both the epilayer and substrate. The fringes are the traces of (0001) planes which can be seen to cross from the substrate into the epilayer without distortions. The angle between the interface and the lattice fringes is approximately 3° as expected due to the off axis substrate preparation. The different contrast between the epilayer and substrate is believed to be caused by the high impurity level in the substrate, mainly, aluminum $(1-10\times10^{19}/cm^3)$ and nitrogen $(1-10\times10^{18}/cm^3)$ as determined by secondary ion mass spectroscopy. No line or planer defects can be seen at the interface. In fact, few defects were observed in the entire XTEM sample.

Figure 5:
FIG. 5 is a plan view TEM micrograph of a film similar to that illustrated in FIG. 3(a) and FIG. 4. This microphraph was obtained with the electron beam parallel to [0001] and shows the absence of double positioning boundaries in the film.

In order to examine a larger area of the bulk 6H SiC thin film, plan view TEM was used. Contrary to the growth of SiC on conventional (i.e., "on-axis") 6H SiC substrates, no DPBs were observed. A typical micrograph which was taken at [0001] pole is shown in FIG. 5. The irregular contrast bends in this micrograph are believed to be strain contours which were caused during ion milling. Both XTEM and plan view TEM verified that very high quality, monocrystalline 6H SiC films had been grown on the "off axis" 6H SiC substrate.

Electrical Properties

For the electrical measurements of the films after growth, the sample surface must be very clean in order to eliminate surface leakage. Therefore, the as grown thin films were oxidized and etched under the same conditions as previously mentioned to remove the top 500 Å of the as grown layer. The carrier type and concentration in the films were measured using Hewlett Packard 4145A semiconductor parameter analyzer and a LEI Model 2019 Miller Feedback Profiler, respectively, coupled with a mercury probe. Electrical properties of the films were further evaluated by thermally evaporating a 2000 Å thick layer of Au onto the entire surface of the thin films just after stripping the thermal oxide layers.

Figure 6:
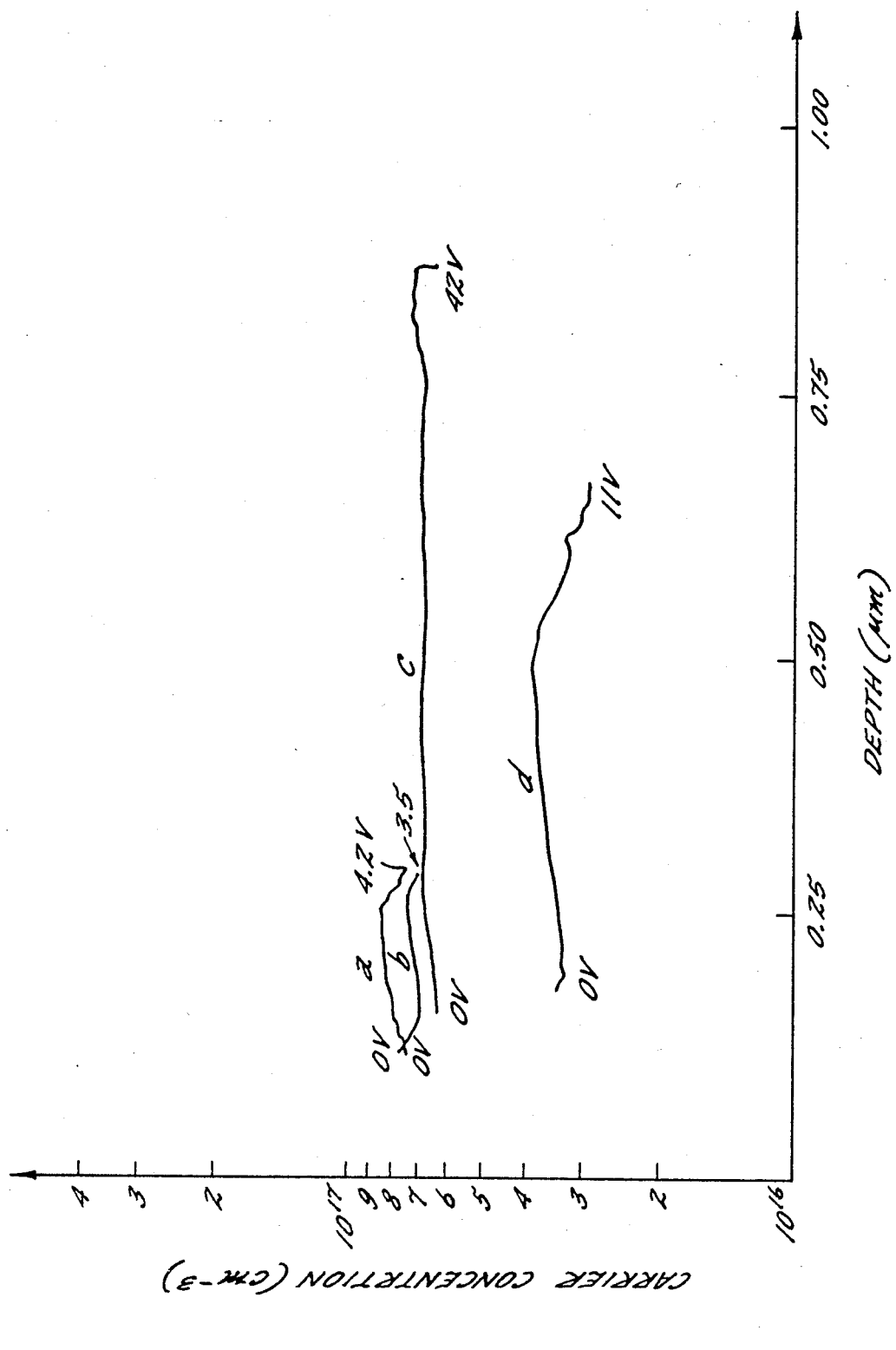
FIG. 6 is a graph of carrier concentration as a function of depth with curve "C" corresponding to a 2 μm, unintentionally doped 6H SiC thin film of the invention.

The concentration of active carriers and the distribution of these carriers as a function of depth in the Alpha-SiC films in this study were measured using a differential C-V method. The conductivity of the unintentionally doped 6H SiC thin films was always found to be n-type, as expected. The carrier concentration was in the range of $1\text{-}1\times10^{16}/cm^3$. A typical plot of carrier concentration versus depth for one of these 6H SiC films is shown in FIG. 6. At an electrical potential of 42 V, the leakage current is only 0.1 $\mu A$, whereas the leakage current exceeds the allowed value for the instrument (100 $\mu m$).

Figure 7:
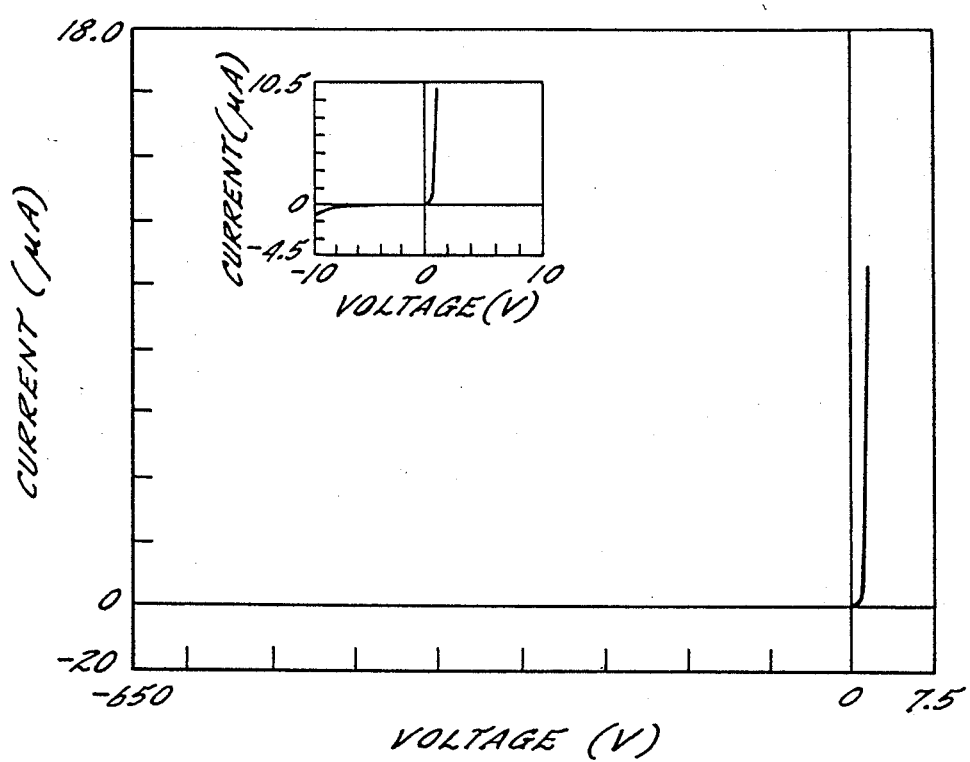
FIG. 7 is a current-voltage characteristic plot of an Au Schottky diode fabricated on a 6H SiC thin film of the invention.
Figure 8:
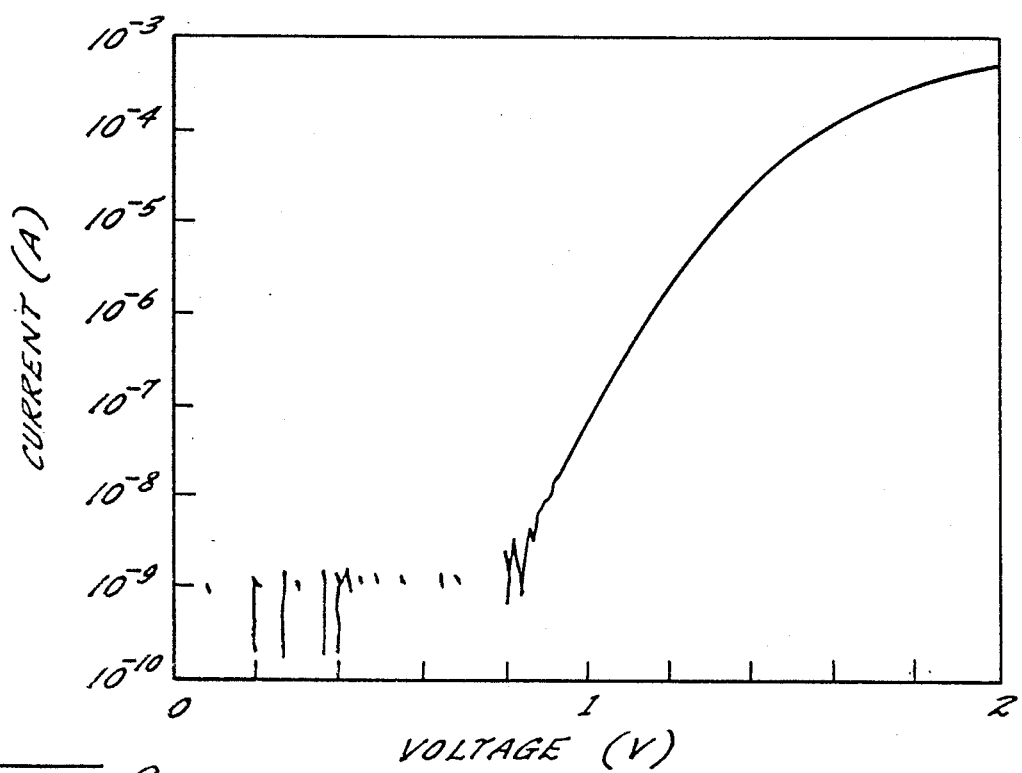
FIG. 8 is a semilogarithimic plot of current-voltage characteristics of the Schottky diode under forward bias. The ideality factor, n, is 2.15.

Au Schottky barrier diodes were fabricated on an unintentionally doped n-type 6H SiC film grown on a 6H SiC $C(000\bar{1})$ substrate 3° off towards one of the $<11\bar{2}0>$ directions. The epilayer was about 2 $\mu m$ thick with a carrier concentration of $7\times10^{16}/cm^3$. FIG. 7 shows the typical current-voltage characteristics of the diodes. At a reverse bias of 55 V, the leakage current is 2.5 nA $(3.2\times10^{-5}A/cm^2)$ which is two orders of magnitude lower than previously reported values for Alpha-SiC on Alpha-SiC at a reverse bias of 40V. When the reverse bias increases to 65 V, the leakage current increases to 30 nA $(3.8\times10^{-4}A/cm^2)$. Compared with the Au Schottky barrier diodes made on other silicon carbide films, the leakage current is greatly reduced. The forward bias LogI versus V curve for the Au Schottky diode is shown in FIG. 8. The ideality factor, n, was determined to be 2.1 from the slope of the linear part of the plot. The saturation current, $J_s$, obtained from the intersection of the straight line portion of this plot with the current axis is $1.53\times10^{-11}$ $A/cm^2$.

Theory of "Off-Axis" Homoepitaxial Growth

While the inventors do not wish be bound to any particular theory, it is useful to discuss the large differences in the surface morphologies of the films grown on the 6H SiC (0001) substrates tilted towards $[11\bar{2}0]$versus $[1\bar{1}00]$—differences apparently caused by the different atomic arrangements of the different misorientations. In both cases the "off axis" preparation of the substrate surfaces (as described earlier) causes a series of steps and ledges to be formed to accommodate the misorientations. The average spacing and height of the steps are largely determined by the degree of misorientation. This stepped surface can also be thought of as a very high index plane. Prior to the CVD process these off-axis substrates have a mirror finish because the steps are microscopic. No roughness is visible to the naked eye or under an optical microscope. However, during CVD, a step bunching process can occur which increases the average height and separation of surface steps and imperfections until they are readily visible under an optical microscope. This step bunching appears to occur for two primary reasons. First, the lateral growth velocity of a step is inversely proportional to its height. Therefore, if steps are nonuniform on a surface then those of smaller height will "overtake" larger steps creating step bunching and therefore increasing surface roughness. Step bunching can also be caused by the nonuniform absorption of impurities thus slowing the lateral growth of some steps. It is this latter mechanism which is believed to be dominant in the present case as discussed below.

As previously discussed, the films grown on SiC (0001) substrates prepared off axis in the [1$\bar{1}$00] direction were significantly rougher than those grown on [11$\bar{2}$0] direction off axis substrates. This may be explained by examining the orientation of the steps created in these two different cases. Steps on the [1$\bar{1}$00] off axis substrates are roughly parallel to the closest packed direction in the (0001) surface; the [11$\bar{2}$0] direction. Thus, these steps are relatively smooth low energy steps and contain relatively low incorporation sites for easy lateral growth. Consequently, growth is slow and is easily poisoned by the absorption of impurity atoms. This causes steps bunching and a rough surface. On the other hand, steps on the [11$\bar{2}$0] off axis substrates are parallel to [1$\bar{1}$00] direction on the substrate surface. This is not a close packed direction and therefore the steps contain many more kinks which can act as incorporation sites for lateral growth. Therefore, the actual surface area and the lateral growth rate of these steps is increased over the case of a step parallel to the closest packed direction. Consequently, the effect of impurity atoms is minimized, resulting in a relatively smooth as grown surface.

There are also theoretical reasons why 6H-SiC films were obtained in this research at temperature where Beta-SiC is generally more stable, as well as why double positioning boundaries (DPBs) were not obtained in these 6H-SiC films. It appears that both of these phenomena may be directly attributed to the nucleation phase of the film on the off axis substrates. As is well known, DPB's are caused by nucleation on two equivalent sites on the substrate surface (for example, utilizing ABC stacking nomendation, B sites or C Sites can be the nucleation sites on an A type substrate surface. As these nuclei grow together, boundaries form between them which are referred to as (DPBs). However, if the natural (0001) plane is lapped a few degrees off from the exact <0001> direction, many steps and kinks are created on the surface. Nucleation is then controlled by these kinks and step sites rather than the flat surface. Therefore, if surface diffusion is sufficient and the steps are sufficiently close together, the atoms incorporate along these edges. Since a single type site is defined by these edges (assuming very long stacking faults do not exist in the near surface region of the substrate) domains separated by DPBs are not able to form. However, due to this step nucleation, Beta-SiC is not formed even at relatively low growth temperatures where it is usually favored. Rather a thin film with the identical crystal structure as the substrate, e.g., 6H SiC, is grown.

While the present invention has been described by reference to preferred embodiments and preferred process parameters, it will be appreciated that modifications may be made without departing from the true spirit and scope of the invention.

That which is claimed is:

1. A method of producing a device quality silicon carbide film on a silicon carbide substrate of the same polytype comprising:
   homoepitaxially depositing a film of an Alpha-SiC polytype on a prepared planar surface of an Alpha-SiC substrate, wherein the planar surface is inclined more than one degree off axis with respect to a basal plane thereof substantially towards one of the <11$\bar{2}$0> directions.

2. A method as claimed in claim 1 wherein the polytype of both the substrate and the film is 6H SiC.

3. A method as claimed in claim 1 wherein the film is homoepitaxially deposited under conditions encouraging uniform growth rate thereacross, resulting in a film of substantially uniform thickness.

4. A method as claimed in claim 1 wherein the off axis inclination is in the range from approximately 3° to approximately 12°.

5. A method as claimed in claim 1 wherein the off axis inclination in the range from approximately 3° to approximately 6°.

6. A method as claimed in claim 1 wherein the off axis inclination is approximately 3°.

7. A method as claimed in claim 1 wherein the planar surface of the substrate is prepared for the deposition step in such a manner as to expose on an atomic level a stepped surface which provides nucleation opportunities in all three directions to thereby encourage nucleation and subsequent crystal growth of a desired Alpha-SiC polytype.

8. A method as claimed in claim 7 wherein the substrate surface is prepared by polishing, oxidizing and etching said surface.

9. A method as claimed in claim 1 including the step of fabricating an electronic device on the film.

10. A method of producing a monocrystalline 6H SiC thin film homoepitaxially deposited on an off axis 6H SiC substrate, wherein the film is characterized by a smooth surface morphology, substantially uniform thickness and a low, device quality defect level, said method comprising:
   lapping a 6H SiC substrate crystal to expose a planar surface that is inclined more than one degree off axis with respect a basal plane thereof substantially towards one of the <11$\bar{2}$0> directions;
   preparing the off axis planar surface of the substrate to be receptive to epitaxial growth thereon;
   heating the substrate crystal in a growth chamber;
   introducing a carrier gas, a vaporized silicon-containing material and a vaporized carbon-containing material into the growth chamber while providing sufficient energy to create surface diffusion of silicon and carbon species at the substrate planar surface and establish a homoepitaxial growth of monocrystalline 6H SiC; and
   maintaining the carrier gas, silicon-containing material and carbon-containing material flows and the energy levels for a time sufficient to grow a film of desired thickness.

11. A method as claimed in claim 10 wherein the step of preparing the off axis planar surface to be receptive to epitaxial growth comprises the steps of polishing, oxidizing and etching said surface.

12. A method as claimed in claim 10 wherein the 6H SiC substrate crystal is a wafer cut from a sublimation-grown crystal.

13. A method as claimed in claim 10 wherein the growth chamber is maintained at a temperature on the order of about 1350° C. to about 1800° C.

14. A method as claimed in claim 10 wherein the growth chamber is maintained at a temperature on the order of about 1400° C. to about 1700° C.

15. A method as claimed in claim 10 wherein the carrier gas is $H_2$.

16. A method as claimed in claim 10 wherein the carrier gas is $H_2$, the vaporized silicon-containing material is a $SiH_4$ source gas and the vaporized carbon-containing material is a $C_2H_4$ source gas.

17. A method as claimed in claim 10 wherein the homoepitaxial growth of the monocrystalline 6H SiC film is achieved at temperatures that would produce a Beta-SiC film under identical growth conditions if grown directly on a basal plane of the 6H SiC substrate.

18. A method as claimed in claim 10 including the step of introducing a dopant into the growth chamber during epitaxial growth of the monocrystalline 6H SiC.

19. A method as claimed in claim 18 wherein the monocrystalline 6H SiC film is doped by bubbling an $H_2$ carrier gas through liquid $Al(CH_3)_3$.

20. A method of producing a device quality silicon carbide film on a silicon carbide substrate, said method comprising:
   producing by sublimation a large, device quality Alpha-SiC single crystal;
   slicing the crystal to form wafers;
   preparing one of the wafers to establish a planar surface that is inclined more than one degree off axis with respect to a basal plane of the crystal substantially towards one of the $<11\bar{2}0>$ directions;
   depositing a film of Alpha-SiC on the planar surface of the substrate.

21. A method as claimed in claim 20 wherein the polytype of both the substrate and the film is 6H SiC and the angle of inclination is between approximately 3° and approximately 12°.

* * * * *

UNITED STATES PATENT AND TRADEMARK OFFICE
CERTIFICATE OF CORRECTION

PATENT NO. : 4,912,064

DATED : March 27, 1990

INVENTOR(S) : Kong et al.

It is certified that error appears in the above-identified patent and that said Letters Patent is hereby corrected as shown below:

Column 4, line 12, delete "sublimation" and insert-- Sublimation--.

Column 8, line 32, delete "$1-1 \times 10^{16}/cm^3$" and insert --$1-10 \times 10^{16}/cm^3$--.

Signed and Sealed this

Fourth Day of February, 1992

Attest:

HARRY F. MANBECK, JR.

*Attesting Officer*    *Commissioner of Patents and Trademarks*

UNITED STATES PATENT AND TRADEMARK OFFICE
CERTIFICATE OF CORRECTION

PATENT NO. : 4,912,064 Page 1 of 1
DATED : March 27, 1990
INVENTOR(S) : Hua-Shuang Kong, Jeffrey T. Glass and Rpbert F. Davis It is certified that error appears in the above-identified patent and that said Letters Patent is hereby corrected as shown below:

Column 1,
Line 5, insert the following statement prior to "FIELD OF THE INVENTION"
-- The U.S. Government has paid-up license in this invention and the right in limited circumstances to require the patent owner to license others on reasonable terms as provided for by the terms of contract N00014-82-K-0182 awarded by the Office of Naval Research. --

Signed and Sealed this

Eighth Day of March, 2005

JON W. DUDAS
*Director of the United States Patent and Trademark Office*